United States Patent [19]

Dlugokecki et al.

[11] Patent Number: 5,406,117

[45] Date of Patent: Apr. 11, 1995

[54] RADIATION SHIELDING FOR INTEGRATED CIRCUIT DEVICES USING RECONSTRUCTED PLASTIC PACKAGES

[76] Inventors: Joseph J. Dlugokecki, 13666 Quiet Hills Dr., Poway, Calif. 92064; Joseph R. Florian, 11207 Zapata Ave., San Diego, Calif. 92126

[21] Appl. No.: 164,139

[22] Filed: Dec. 9, 1993

[51] Int. Cl.⁶ .................................... H01L 23/28
[52] U.S. Cl. ............................ 257/659; 257/660; 257/790; 257/921
[58] Field of Search ............... 257/925, 659, 787, 790, 257/921, 660

[56] References Cited

U.S. PATENT DOCUMENTS

| | | | |
|---|---|---|---|
| 4,661,837 | 4/1987 | Sono | 357/84 |
| 4,839,716 | 6/1989 | Butt | 357/74 |
| 4,953,002 | 8/1990 | Nelson et al. | 257/659 |
| 5,138,430 | 8/1992 | Gow et al. | 357/70 |
| 5,149,662 | 9/1992 | Eichelberger | 437/8 |
| 5,166,772 | 11/1992 | Soldner et al. | 257/659 |
| 5,294,826 | 3/1994 | Marcantonio et al. | 257/659 |

FOREIGN PATENT DOCUMENTS

| | | |
|---|---|---|
| 54-4781 | 10/1980 | Japan . |
| 60-124834 | 3/1985 | Japan . |
| 2278740 | 11/1990 | Japan . |

OTHER PUBLICATIONS

Charles A. Harper, "Electronic Packaging and Interconnection Handbook", 1991, pp. 6.41–6.49., McGraw-Hill.
Caroline Kovac et al., "Plastic Package Fabrication", 1989, vol. 1, pp. 470–480., ASM International.

*Primary Examiner*—Rolf Hille
*Assistant Examiner*—Roy Potter
*Attorney, Agent, or Firm*—Spensley Horn Jubas & Lubitz

[57] ABSTRACT

A pre-molded plastic package has encapsulation material removed so that an upper cavity is formed above the die and its associated wirebonds and a lower cavity is formed below the die attach pad and lead frame. Advantageously, the encapsulating material is removed without damaging the die, its associated wirebonds or the lead frame. An upper shield is then mounted on the top side over the still encapsulated die and wirebonds. Encapsulating material, such as epoxy, is then placed about the upper shield and cured. A lower shield is then mounted on the bottom side the die attach pad and lead frame. Encapsulating material is also placed over the lower shield and cured. Advantageously, the invention provides a process alternative whereby the shields can be installed at a very low per unit cost and in only minutes per unit without the need for custom tooling.

27 Claims, 4 Drawing Sheets

RADIATION SHIELDING FOR INTEGRATED CIRCUIT DEVICES USING RECONSTRUCTED PLASTIC PACKAGES

FIELD OF THE INVENTION

The present invention relates, in general, to radiation shielded packages for integrated circuit (silicon) chips and, more specifically, to a reconstructed, shielded plastic package and a method of adding radiation shields to a pre-fabricated plastic encapsulated package.

BACKGROUND

The natural radiation in space is caused by electrons and protons that are trapped by the magnetic field of the earth. The trapped protons occupy a belt that ranges from 1 to about 3.8 earth radii (when measured at the equator). The electrons are trapped in an inner zone that ranges from 1 to about 2.8 earth radii and an outer zone that ranges from about 2.8 to about 12 earth radii, one earth radius being about 4000 miles.

In space applications, integrated circuits are dependent to a large extent on external component shielding to protect the components from the bombardment of this natural radiation. External component shielding consists of satellite material, printed circuit boards, and any other material that make up a space craft. When necessary, specially designed boxes constructed of selected shielding materials are also employed.

Although, approximately 80% of the integrated circuits that are sold and produced today are packaged or encapsulated in epoxy, heretofore, plastic encapsulated packages have not been used successfully in space applications. The primary reason for their lack of success is because moisture easily penetrates through plastic packages which can cause dendritic growth and corrosion which consequently may result in electrical shorts and open circuit conditions. Secondly, the accumulation of radiation eventually causes them to fail. Although, plastic packages can be used in space (providing that sufficient outer shielding is also included), the excess outer shielding does add a considerable amount of weight.

While it is known in the art to add thermally conductive heat sinks to the die attach pad in a plastic package, the inventors are not aware of any method of molding an upper shield into a plastic package because of the difficulty in securely positioning the shields (i.e., the possibility of an upper shield moving during the molding process could easily short to the die and wirebonds). Even if it were possible to mold shields into the package, shields would have to be customized for each die size and package combination. Given the low volume of components needed, this approach would be extremely costly.

Thus, the state-of-the-art for providing environmental protection and total dose radiation shielding of an integrated circuit die at the package level consists of modifying existing alumina ceramic package designs or designing new alumina ceramic packages to incorporate copper tungsten shield plates. This is achieved by first cofiring a copper tungsten lower plate as an integral part of a cofired alumina ceramic package. The lid of the package then forms the upper shield. The exact location, thickness and material used for the shielding plates are critical factors which determine the shielding effectiveness of a given device.

What is needed is a shielded package which is lightweight, low cost, which can be manufactured quickly and inexpensively, and which provides protection from the environment, as well as, total dose radiation shielding of the integrated circuit die.

SUMMARY OF THE INVENTION

The present invention provides a plastic package for integrated circuit chips in which radiation shields can be embedded into pre-fabricated plastic encapsulated packages to provide radiation shielding characteristics similar to that provided by the prior art.

The present invention is directed towards a reconstructed plastic package and a method of re-configuring any pre-fabricated plastic package so that shields can be placed above and below the die and then sealed with additional encapsulation material. The reconstructed encapsulated package is mechanically identical to the original part, with the only modification being a slight increase in thickness. Advantageously, most existing off-the-shelf devices which have been encapsulated using the conventional plastic packaging method can be modified using the method of the present invention. Thus, no additional tooling is required during the transfer molding process of the original component.

The present invention, advantageously, takes a pre-fabricated plastic package and forms a cavity above and below the chip using one of several removal methods. A thin layer of the original encapsulant material over the chip and the wirebonds is left in tact, thus maintaining the integrity of the original encapsulation of the die and wirebonds. An upper shield is located over the die and wirebonds. All remaining space in the cavity is filled with a polymeric insulating material. A lower shield is located in the lower cavity. Additional polymeric insulating material is used to secure both the upper and lower shields in place. Preferably, a thin wall is left around the perimeter on the top and bottom of the package to facilitate holding the liquid encapsulation material.

The upper shield covering the chip may be dome-shaped. The lower shield is preferably flat, but could be dome-shaped. Advantageously, once the shield is installed, the paths leading to the interior of the package for moisture penetration are minimized. Any moisture condensation which occurs on the top and bottom surfaces cannot penetrate through the upper and lower shields. Reliability of the device is therefore significantly improved due to reduction of the moisture penetration paths.

The shielding material can be any high Z, high density material. Copper-tungsten alloy has been used because of its high Z, high density, machinability, and compatibility with other materials. Using 90% tungsten and 10% copper, about 2 grams/cm$^2$ will shield to the bremsstrahlung limit. At this limit, all of the electrons are deflected and only x-rays will penetrate, and further increases in the shielding material is not nearly effective as the initial shielding. Other materials are possible as well.

The present invention further contemplates a method of adding shielding to a plastic package by removing existing encapsulating material from a pre-fabricated plastic package to form a cavity above and below the die, and then reconstructing the package by adding shields and insulating material back into the cavities.

A key feature of the reconstructed package of the present invention is that the upper and lower cavities are formed by removing the encapsulating material without damaging the die, wirebonds, lead frame or the encapsulation material which is in intimate contact with the critical components of the structure (i.e., the die and the wirebonds). The depth of the cavity is to within 10-20 mils of the surface of the lead frame and to within 5-10 mils radius around the wirebonds. In the preferred embodiment, the exact depth of the cavity is pre-determined by precise measurement of the height of the wirebonds as verified by X-ray examination. The dose levels of the X-rays do not in any way affect the chip performance or characteristics and, in fact, is done routinely in the manufacture of hybrid microelectronic circuits to verify component height.

The cost of design and fabrication of a plastic package made in accordance with the present invention will be significantly lower than the cost of modifying or designing new ceramic packages or incorporating customized shielding during the transfer molding process. Additionally, the weight of the reconstructed plastic package is much less than the ceramic equivalent. Furthermore, the expense and difficulty of encapsulating shields into plastic packages can be eliminated using the present invention.

Since a shielded plastic package significantly reduces the weight of the package, the present invention is a highly desirable improvement over the prior art methods which employ modification of ceramic packages.

The present invention thus provides a process alternative whereby the die can be shielded in plastic encapsulation at a very low per unit cost and in only minutes per unit.

BRIEF DESCRIPTION OF THE DRAWINGS

Further features and advantages of the present invention may be more readily understood with reference to the following description taken in conjunction with the accompanying drawings, in which.

DESCRIPTION OF THE PREFERRED EMBODIMENT

The following description is of the best mode presently contemplated for practicing the invention. This description is not to be taken in a limiting sense but is made merely for the purpose of describing the general principles of the invention. The scope of the invention should be ascertained with reference to the issued claims. In the description of the invention that follows, like numerals or reference designators will be used to refer to like parts or elements throughout.

The standard, most used process to package an integrated circuit die has been the plastic encapsulated package, constructed primarily of a metal lead frame and a polymeric insulating material. Because the process of encapsulating die in molded plastic packages can be easily automated, plastic packages are relatively inexpensive compared to ceramic or hybrid hermetic packages and consequently have become the mainstay of the electronics industry.

Figure 1:
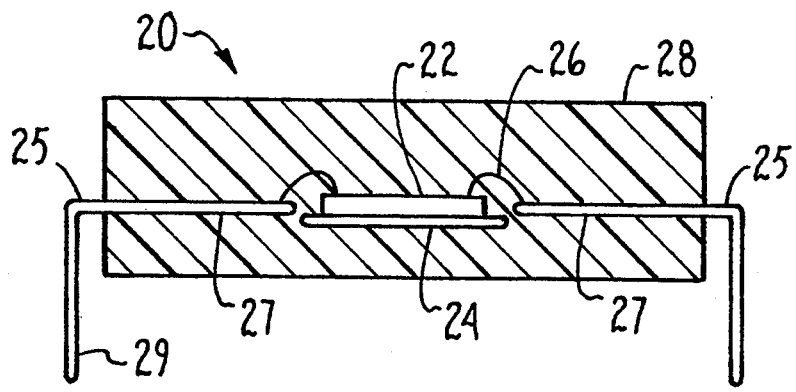
FIG. 1 shows an cross-sectional view of a plastic dual-in-line package (DIP)
Figure 2:
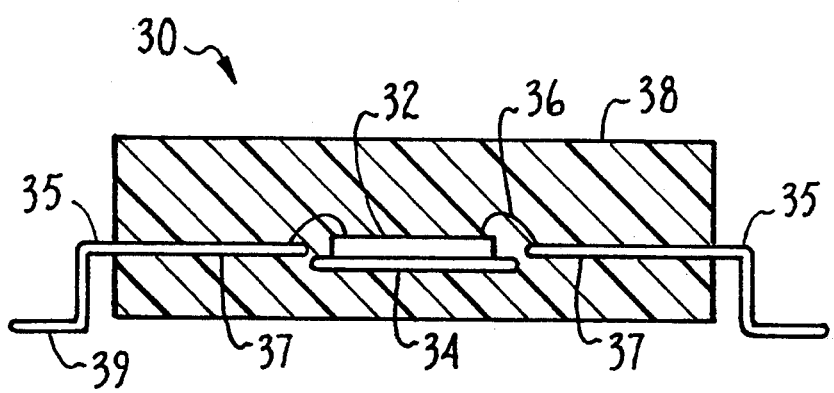
FIG. 2 shows an cross-sectional view of a plastic quad flatpack (QFP)
Figure 3:
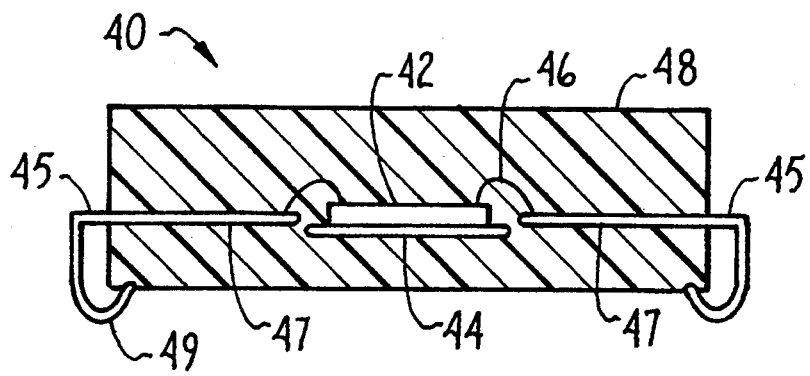
FIG. 3 shows an cross-sectional view of a plastic leaded chip carrier (LCC)

With a few modifications, the basic assembly process for plastic encapsulation can be used to construct a variety of package types. For example, FIG. 1 illustrates a pin-in-hole package: a dual-in-line package (DIP). FIGS. 2-3 illustrate two surface mount packages: a plastic leaded chip carrier (PLCC) and a quad flatpack (QFP), respectively. Each of these plastic packages are constructed from the same basic assembly techniques, which techniques are well known in the art.

The encapsulation process for fabricating plastic packages is known as transfer molding. For a complete description on transfer molding, and the fabrication of plastic packages in general, see for example, *Packaging-Electronic Materials Handbook*, 1989, Vol. 1, pp. 470-480, published by ASM International, which reference is hereby incorporated herein by reference.

Briefly, and with reference to the plastic package shown in FIG. 1, the fabrication of a plastic package 20 begins with a metal lead frame 25 that is either stamped or chemically etched. The choice of lead frame material depends on die attach methods, reliability, thermal requirements, and mounting requirements (through-hole or surface mount). The lead frame 25 may be comprised of copper, kovar, nickel, alloy 42, or aluminum, with the two most commonly used materials being alloy 42 and copper. The leads extending from the resultant package can then be soldered directly to a printed circuit board.

Once a die 22 has been cut or diced from a wafer (not shown), the die 22 is attached to the center pad 24 of the lead frame 25, hereinafter referred to as the die attach pad 24. Attachment can be made by using a gold-silicon eutectic or a polymer adhesive, such as epoxy or polyimide. Following die attachment, each of a plurality of contact pads (not shown) on the die 22 are interconnected to a respective one of a plurality of wirebond pads 27 on the lead frame 25 by wirebonds 26. The wirebonding process can be accomplished in a variety of ways, for example, by ultrasonic vibration pressure, by thermocompression bonding, or by a combination of both methods (called thermosonic bonding).

After the wirebonds 26 have been attached, the die 22 and wirebonds 26 are encapsulated in a plastic or polymeric material defined by the outline 28. The encapsulating material serves as a dielectric insulator and shields against environmental degradation. The encapsulation process, known in the art as transfer molding, is the method used to mold thermosetting polymers (i.e., polymers that are fluid at low temperatures but which react irreversibly when heated to form a highly crosslinked network which is no longer capable of being melted). The result is encapsulation of the integrated circuit die 22 and the wirebonds 26 within the encapsulating material 28, with the legs 29 of the lead frame 25 extending from the body of the package. This encapsulation process provides an electrical connection from the contact pads on the die to the outside world and provides excellent protection to the silicon chip and the wires.

The encapsulating materials used, as indicated above, are thermosetting polymers. The encapsulating material ideally has the following properties: high purity (particularly with respect to ionic contaminants); excellent adhesion to other packaging materials (such as Si, passivation, lead frame, etc.); poor adhesion to mold surfaces; impermeability to moisture and low moisture absorption; sufficient rigidity to protect the die; low coefficient of thermal expansion (CTE); low elastic modulus; heat resistance sufficient to withstand soldering operations; ease of processing; and low cost.

While no polymer material satisfies all of these requirements, formulations of epoxy resins, hardeners, and inorganic fillers have been developed and are in widespread use. Epoxies are useful as encapsulant materials due to a combination of factors including low cure shrinkage, fast cure speed, a polar nature, and the ability to be blended with a wide variety of modifiers to impart the desired mechanical properties. Epoxy monomers and prepolymers are commercially available in a wide variety of viscosities, and thus are easily tailored to meet a particular molding requirement. Other thermosetting polymers, such as silicones and unsaturated polyesters, are also employed to a lesser degree. The primary use of silicone polymers is in high-temperature applications (in the range of 200° C.) that warrant the extra cost. Advantages of unsaturated resins include extremely fast cure kinetics, the cure reaction does not generate any by-products, and low cost, however, they also have inferior strength and environmental resistance compared to epoxies and silicones.

In the preferred embodiment, described in more detail below, the preferred encapsulating material is epoxy and epoxy-based resins (hereinafter referred to simply as "epoxy"). However, it is understood that any of the plastic or polymeric insulating materials described above, or any plastic or polymeric material yet to be invented which have similar properties, could be utilized with the present inventive method and are within the scope of the present invention.

FIGS. 1-3 illustrate but three examples of plastic packages, among the many plastic packages known in the art, which may be modified by the method of the present invention. Other plastic packages that may be modified using the present inventive method include, but are not limited to, single-in-line packages (SIPs), zigzag-in-line packages (ZIPs), quad-in-line packages (QUIPs), small outline (SO) packages, fine-pitch quad flatpacks (FQFPs), pin grid arrays (PGAs), etc. For a complete description of the various plastic package families and their characteristics, see for example, *Electronic Packaging and Interconnection Handbook*, Charles A. Harper, 1991, pp. 6.41–6.49, which reference is incorporated herein by reference. It is understood that the packages shown in FIGS. 1–3 are presented for illustration purposes only, and that the present invention can be extended to all pre-fabricated plastic packages.

The packages shown in FIGS. 1–3 are also included to illustrate the similarities in construction in plastic packages. Each package (20, 30 and 40) has, respectively, a die (22, 32 and 42) mounted onto a die attach pad (24, 34 and 44), a lead frame (25, 35 and 45), and a set of wirebonds (26, 36 and 46). Each lead frame contains a plurality of leads or fingers (not shown) for interconnection to a plurality of contact pads (also not shown) on each die via the respective set of wirebonds. Each package (20, 30 and 40) includes encapsulation material (defined by outline 28, 38 and 48, respectively). Each lead further has a plurality of wirebond pads (27, 37, 47) and legs (29, 39, 49) which extend from the encapsulated portion (28, 38, 48) of the package, respectively.

Figure 4:
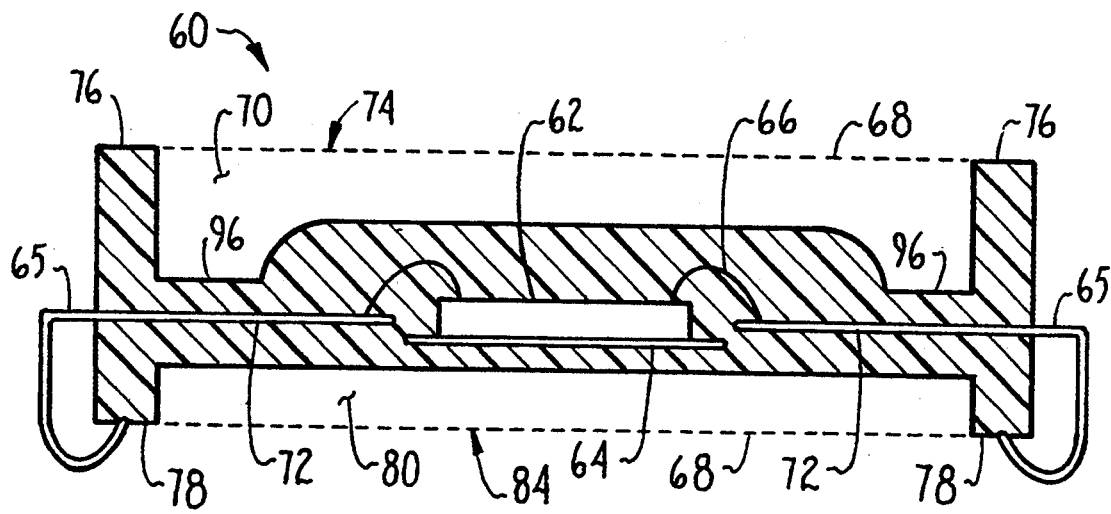
FIG. 4 shows a cross-sectional view of a pre-fabricated, plastic leaded chip (LCC) carrier modified in accordance with the present inventive method and illustrating the/area which is removed.
Figure 5:
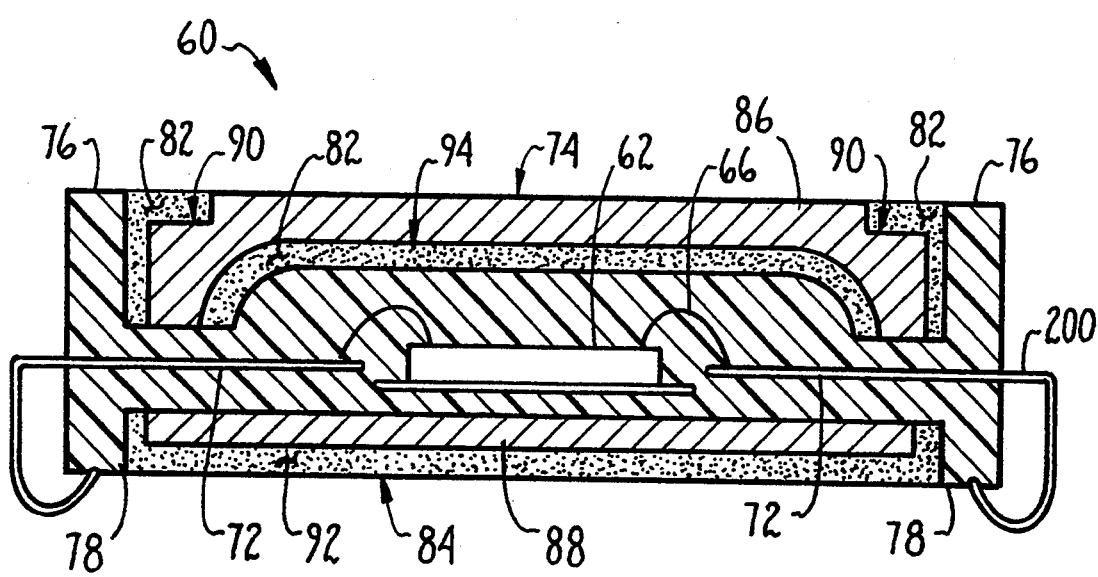
FIG. 5 shows a cross-sectional view of the embodiment shown in FIG. 4 using a pre-fabricated, plastic leaded chip carrier (LCC) re-constructed in accordance with the teachings of the present invention.

In the preferred embodiment, shown in FIGS. 4 and 5, a plastic package is fabricated or procured using the transfer molding techniques described above. FIGS. 4 and 5 show a cross-sectional view of a pre-fabricated plastic leadless chip carrier (LCC) before and after the shields are attached, respectively.

While the following will be directed toward a reconstructed plastic leadless chip carrier (LCC), it is understood that any of the plastic packages known in the art may be modified and reconstructed using the present inventive method and are within the scope of the present invention.

As seen in FIG. 4, a plastic leadless chip carrier 60 is shown having a die 62 mounted onto a die attach pad 64 and electrically connected to a lead frame 65 using wirebonds 66. The original outer dimension of the package is indicted by dotted lines 68. An upper cavity 70 is formed on the top side 74 of the package 60 over the die 62, the wirebonds 66 and a portion 72 of the lead frame 65. A lower cavity 80 is formed on the bottom side 84 of the package 60.

In FIG. 5, upper and lower radiation shields 86 and 88 are then placed into the upper and lower cavities 70 and 80 (FIG. 4), respectively. The upper shield 86 is domed-shaped so as to provide maximum shielding and moisture insulation over the die 62 and its associated wirebonds 66. The lower shield 88 is preferably flat, but could also be domed-shaped similar to the upper shield 86.

The cavities 70 and 80 (FIG. 4) are filled with a first and second epoxy material 82 and 92, respectively, as described in more detail below. It is understood that the first and second epoxy materials 82 and 92 are not necessarily different epoxy materials; they could be the exact same formulation or, owing to the fact that they could be dispensed at different times, they could have slightly different formulations. The upper shield 86 has a recess 90, which allows the first epoxy material 82 to flow thereover during the encapsulation process. The lower shield 88 preferably has a layer of the second epoxy material 92 on top thereof. The purpose of flowing the first and second epoxy material 82 and 92 over the upper and lower shields 86 and 88, respectively, is to permanently secure the shields in place once the epoxy materials have been cured. A wall 76 and 78 is left along the perimeter of top and bottom sides 74 and 84 of the package 60 to support the epoxy 82 and 92 during the curing process, respectively.

Figure 6:
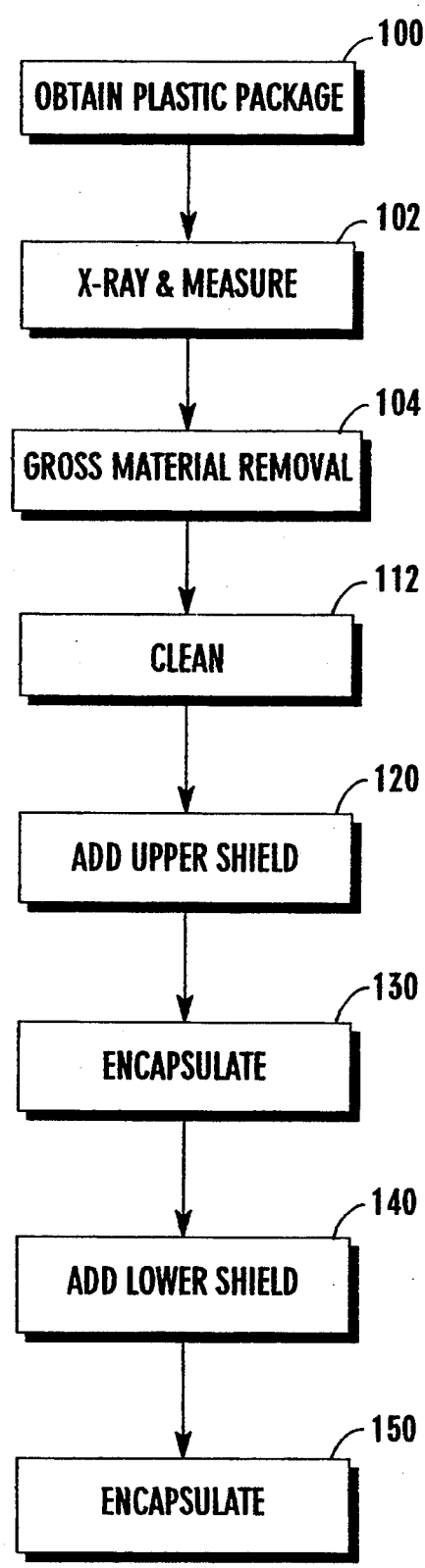
FIG. 6 describes the process steps necessary to reconstruct the pre-fabricated, plastic package of the present invention.

In FIG. 6, the process of removing epoxy to create the cavities 70 and 80 and encapsulating the shields is described in more detail. First, in block 100, the pre-fabricated plastic package 60 is obtained either by fabricating or by procuring the packages. In block 102, an X-ray is taken of the package 60 in the same view as shown in FIG. 4. Measurements are made on the X-rays to determine the precise height of the wirebonds 66.

In block 104, the present invention consists of the step of gross removal of epoxy from both the top and bottom surfaces of the package. Currently known process options, as defined by this invention, for gross removal of the surface epoxy may include sand blasting, plasma etching, mechanical grinding, laser etching and chemical etching.

In the preferred embodiment, gross removal is accomplished by clearing away the majority of the solid epoxy using a mechanical grinding technique, i.e., a diamond impregnated dental burr is used. The hand piece of the drill is rigidly held by an arm that allows the hand piece to move only in the vertical direction. A turbo drive spins the burr at a very high speed which is rigidly held by an arm that allows movement only in the vertical direction. The vertical position is precisely controlled with a micrometer as the burr is lowered and cuts into the encapsulant. At this point, the package is moved on the horizontal plane and the side of the diamond impregnated dental burr pulverizes the solid epoxy. The area of removal of the epoxy may be controlled by viewing the process under a microscope while moving the package (which is rigidly held in a chuck) on the horizontal plane. As an alternative method, this process can easily be automated by employing servo motors controlled by digital logic circuits.

With reference to FIG. 4, the depth of cut on the top side 74 is to within 10-20 mils of the surface of the lead frame 72, at points 96 (along the periphery), and to within 5-10 mils radius of the wirebonds 66. These dimensions are chosen so that the die 62, the plurality of wirebonds 66 and the lead frame 72 are not damaged by the grinding process. On the bottom side 84 of the package 60, the depth of cut is likewise to within 10-20 mils of the surface of the lead frame 72 and die attach pad 64.

Next, as shown in FIG. 6, is the cleaning step (block 112) to remove any loose material. Cleaning can be achieved using either a plasma etch, a pressurized liquid impingement, or ultrasonic cleaning. In the preferred embodiment, cleaning is accomplished using deionized water which is delivered to the cavities using a high pressure pulsating liquid ejector device such as that used for cleaning between teeth (a water pick). To remove the water, the water pick washing step is repeated using electronic grade alcohol. Alternatively, ultrasonic cleaning in deionized water and alcohol and/or plasma etching may be used in place of the high pressure liquid impingement cleaning step.

Block 120 includes the attachment of the upper shield 86. The upper shield 86 is installed using thermally cured non-conductive epoxy. With reference to FIG. 5, sufficient amounts of epoxy are dispensed into the top cavity 70 so that the gap 94 between the lower side of the upper shield 86 and the encapsulated die 62 and wirebonds 66 will be filled. The upper shield 86 is then installed over the die, with excess epoxy being squeezed out so that air is not trapped in the gap 94. During the encapsulating step (block 130), the remaining area about the upper shield 86, including the recess 90, is then filled with epoxy and cured. It is very important to remove all the air in the gap 92 since trapped air would tend to create a buildup of pressure once in space and potentially destroy the package. To further ensure that air is not trapped in the gap 94, the curing is preferably performed using a vacuum bake-out, typically at 150°-200° C. for 2-4 hours.

Block 140 indicates the lower shield 88 attachment step. The lower shield 88 is also installed using thermally cured non-conductive epoxy. The lower shield 88 may be placed directly against the die attach pad 64 (thereby also acting as a heat sink), although it may be desirable to dispense some epoxy or other adhesive before adding the shield. During the encapsulating step (block 150), the cavity 80 is then filled with epoxy, the epoxy flowing over and around the lower shield 88. Curing occurs, preferably, using a vacuum bake-out at 150°-200° C. for 2-4 hours.

In an alternative embodiment, the die may be procured with an hermetic overcoat material which is specifically designed to prevent moisture. One example of a hermetic overcoat material which may be used by the present invention is described by its manufacturer, Dow Corning, as a low temperature ceramic composed of a layer of silicon carbide over a layer of silicon dioxide. The hermetic overcoat material is used as an added protection against moisture and does not replace any step described above.

Figure 7:
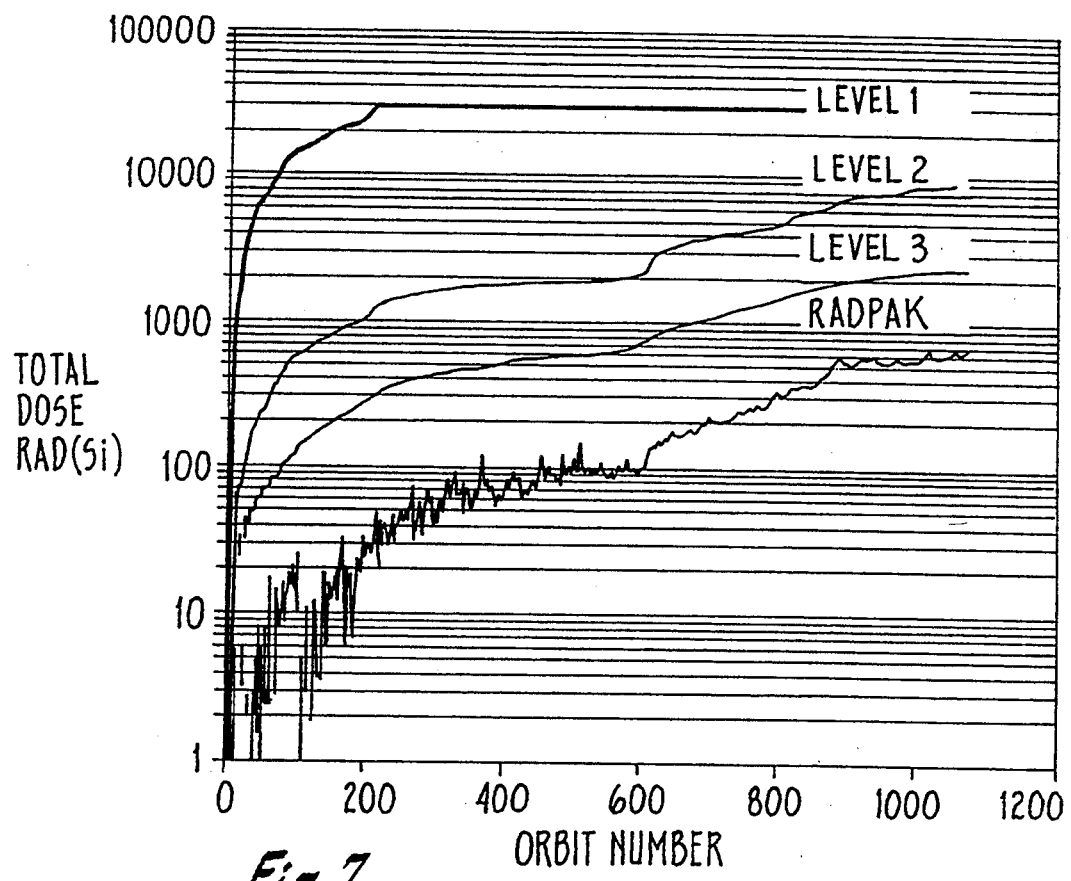
FIG. 7 shows data for the shielding effectiveness of the radiation shielded plastic package (RADPAK) of the present invention in space.

In FIG. 7, experimental data for the shielding effectiveness of the radiation shielded plastic package (RADPAK) of the present invention in space is shown. In this experiment, PMOS dosimeters were placed in TO-5 cans at various levels in the satellite. The TO-5 cans had 20 mil thick Kovar lids which, together with the satellite skin, which is equivalent to a total aluminum (Al) thickness of 65 mils at level one, the highest level. The second level had a PMOS dosimeter below or behind one PC board, with an equivalent total aluminum thickness of 232 mils. The third level had a PMOS dosimeter below or behind two PC boards, with an equivalent total aluminum thickness of 887 mils.

A PMOS dosimeter was also placed in a radiation shielded plastic package (RADPAK) of the present invention at level one. The RADPAK shield comprised 20 mils of 90% tungsten and 10% copper alloy, which is equivalent to 200 mils of aluminum.

The orbit for the experiment explored all radiation belts. The orbit was 300 km perigee (i.e., at the point nearest to the center of the earth) and 36,000 km apogee (i.e., at the point farthest away from the center of the earth) with an 18 degree inclination.

The vertical axis, in FIG. 7, shows the total radiation dose that the PMOS dosimeters detected. The horizontal axis depicts the orbit number, that is, the number of times the satellite circled the earth. Dividing the dose in level one with the dose detected by the RADPAK dosimeter (also at level one) gives the shielding factor for the RADPAK - - - a number that approaches three orders of magnitude and has a shielding effectiveness which is more effective than the 887 mils of equivalent aluminum at the third level.

It should be noted that the equivalence to aluminum can only be applied to the stopping power against heavy charged particles like protons. Numerous calculations have shown that the shielding curve for protons (dose versus depth) flattens out at greater than 1 gram/cm$^2$ of any material.

Shielding against electrons is determined not only by the grams per square centimeter but by the Z of the material. As mentioned earlier, about 2 grams/cm$^2$ of 90% tungsten and 10% copper alloy will shield to the bremsstrahlung limit (i.e., all electrons are stopped and only X-rays still penetrate).

The data shown in FIG. 7 indicates that the RADPAK is not proton limited. That is, if the package was proton limited, the estimated shielding factor expected would be on the order of less than 10. However, FIG. 7 shows a shielding factor of about 1000 (comparing RADPAK to level one), indicating that RADPAK is not proton limited. FIG. 7 shows that the level one dosimeters saturated at orbit 200, which is about 30 Krads. FIG. 7 also shows a magnetic storm starting at orbit number 600. The storm created another outer zone electron belt. Since the RADPAK dosimeter is seen to respond to this storm, it must be seeing only electrons, thus providing another indication that the RADPAK in not proton limited. Since the shielding is not proton limited, the present invention focuses on maximizing the shielding against electrons.

Figure 8:
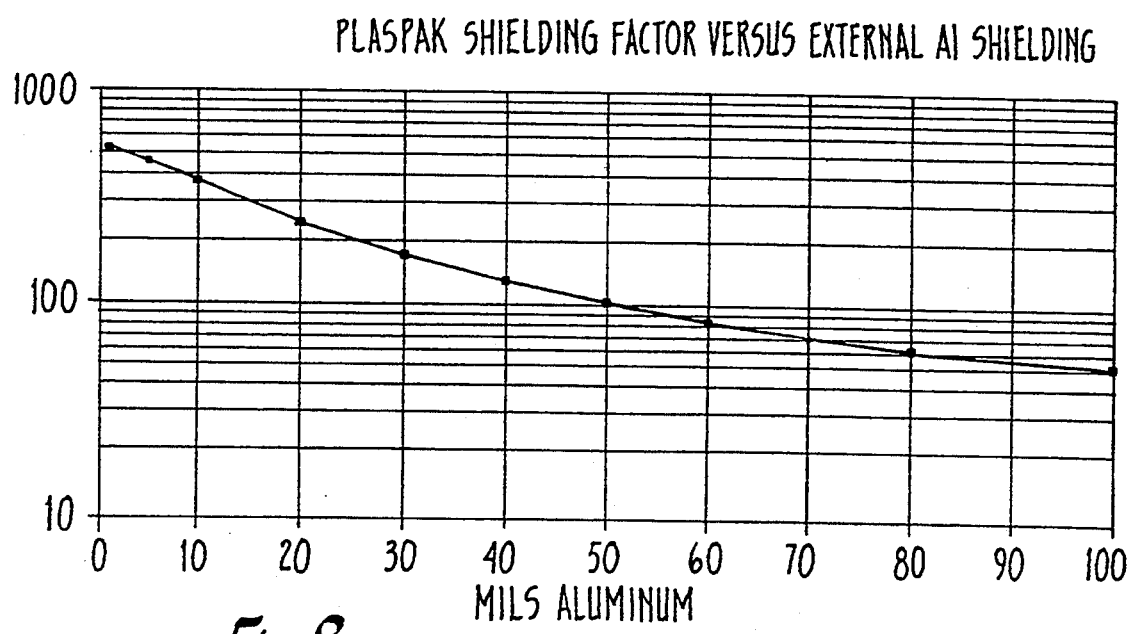
FIG. 8 shows the computed shielding factor of the present invention (that is, the dose in silicon for a standard plastic package divided by the dose in silicon for the shielded plastic package of the present invention) as a function of the thickness of external aluminum (satellite skin).

To further illustrate the shielding effectiveness of the present invention, FIG. 8 shows the computed shielding factor of the present invention as a function of the thickness of external aluminum. The shielding factor is defined as the dose in silicon for a standard plastic package divided by the dose in silicon for the shielded plastic package (RADPAK) of the present invention. It should be noted that even a standard package offers some shielding. Thus, the shielding factor is calculated by determining the total dose inside the standard package after the radiation has penetrated the indicated external aluminum and the standard package material, and dividing by the total dose inside the RADPAK after radiation has penetrated the same aluminum skin and the RADPAK shielding material.

The shielding factor is graphed as a function of aluminum to provide a relative comparison against the satellite's aluminum external skin. Other material can be determined by comparing their relative Z and density to aluminum's. Thus, from the graph shown in FIG. 8, the present invention, when compared to a standard plastic package having an external shield of 50 mils of aluminum, would still have a added shielding factor of 100. Even with a satellite configuration that offers an intrinsic satellite shielding of 100 mils of aluminum, the present invention has the added benefit of a shielding factor of greater than 50.

In designing a shielded package using the present invention, a potential user must consider the shielding factor of the package and the total dose hardness of the unshielded circuit in order to determine the maximum length of the mission before part failure. For example, the response of the PMOS dosimeters is a measure of total dose. Thus, the useful range of these dosimeters is determined by the saturation limit. In general, the device longevity is dependent largely on the type of the device place inside the RADPAK and its radiation susceptibility. The shielding factor, as illustrated in FIG. 8, will depend largely on the thickness of the aluminum chosen, or the equivalent thickness of another, preferably, higher Z, high density material.

The end product is a total dose radiation shielded integrated circuit with external dimensions closely duplicating the original device. The package is extremely light-weight and low cost and provides all the benefits of radiation shielded known in the prior art packages.

Although an exemplary embodiment of the present invention has been shown and described, it will be apparent to those having ordinary skill in the art that a number of changes, modifications, or alterations to the invention as described herein may be made, none of which depart from the spirit of the present invention. All such changes, modifications, and alterations should therefore be seen as within the scope of the present invention.

What is claimed is:

1. A shielded plastic package for shielding an integrated circuit chip against ionizing radiation, comprising:

a plastic package having an integrated circuit chip, a die attach pad and a lead frame encapsulated in a first encapsulating material, the lead frame having a plurality of fingers, the integrated circuit chip having a plurality of contact pads electrically connected by wirebonds to a corresponding one of the plurality of fingers, the package further having the first encapsulating material removed above the integrated circuit chip and the wirebonds and below the lead frame, the first encapsulating material being removed without damaging the integrated circuit chip, the wirebonds or the lead frame;

an upper shield mounted on the top side of the package above the integrated circuit chip and wirebonds wherein the upper shield protects the chip against ionizing radiation to the bremsstrahlung limit;

a lower shield mounted on the bottom side of the package over the lead frame wherein the lower shield protects the chip against ionizing radiation to the bremsstrahlung limit; and means for encapsulating the upper and lower shields in a second and third encapsulating material, respectively.

2. The package as recited in claim 1, wherein:

the first encapsulating material is removed to form a wall along a perimeter of the top side of the package, the wall having a thickness which will contain the second encapsulating material therein.

3. The package as recited in claim 1, comprising:

the first encapsulating material is removed to form a wall along a perimeter of the bottom side of the package, the wall having a thickness which will contain the second encapsulating material therein.

4. The package as recited in claim 1, wherein the upper and lower shields comprises about 1 grams/cm$^2$ of shielding material.

5. The package as recited in claim 1, wherein the upper and lower shields comprise copper tungsten alloy shields.

6. The package as recited in claim 5, wherein the upper and lower alloy shields comprises about 2 grams/cm$^2$ of 90% tungsten and 10% copper.

7. A shielded plastic package for shielding an integrated circuit chip against ionizing radiation, comprising:

a plastic package having a integrated circuit chip, a die attach pad and a lead frame encapsulated in a first encapsulating material, the lead frame having a plurality of fingers, the chip having a plurality of wirebonds electrically connected between each of a plurality of contact pads on the integrated circuit chip and a corresponding one of the plurality of fingers, the package further having the first encapsulation material removed to form an upper cavity and a lower cavity, the upper cavity being formed to within 5–10 mils of the integrated circuit chip and the wirebonds, the lower cavity being formed beneath the lead frame to within 10–20 mils thereof;

an upper shield installed in the upper cavity wherein the upper shield protects the chip against ionizing radiation to the bremsstrahlung limit;

a lower shield installed in the lower cavity wherein the lower shield protects the chip against ionizing radiation to the bremsstrahlung limit; and means for encapsulating the upper and lower shields in a second and a third encapsulating material, respectively.

8. The package as recited in claim 7, wherein:

the first encapsulating material is removed to form a wall along a perimeter of the top side of the package, the wall having a thickness which will contain the second encapsulating material therein.

9. The package as recited in claim 7, comprising:

the first encapsulating material is removed to form a wall along a perimeter of the bottom side of the package, the wall having a thickness which will contain the second encapsulating material therein.

10. The package as recited in claim 7, wherein the upper and lower shields comprises about 1 grams/cm$^2$ of shielding material.

11. The package as recited in claim 7, wherein the upper and lower shields comprise copper tungsten alloy shields.

12. The package as recited in claim 27, wherein the upper and lower alloy shields comprises about 2 grams/cm$^2$ of 90% tungsten and 10% copper.

13. A shielded plastic package for shielding an integrated circuit die against ionizing radiation, comprising:

a plastic package having an integrated circuit die embedded in a first encapsulating material, wherein the first encapsulation material is removed from above the die;

an upper shield mounted on the top side of the package above the die wherein the upper shield protects the die against ionizing radiation to the bremsstrahlung limit;

a lower shield mounted on the bottom side of the package wherein the lower shield protects the die against ionizing radiation to the bremsstrahlung limit; and means for encapsulating the upper and lower shields in a second and third encapsulating material, respectively.

14. The package as recited in claim 13, wherein:

the first encapsulating material is removed to form a wall along a perimeter of the top side of the package, the wall having a thickness which will contain the second encapsulating material therein.

15. The package as recited in claim 13, wherein:

the first encapsulating material is removed to form a wall along a perimeter of the bottom side of the package, the wall having a thickness which will contain the third encapsulating material therein.

16. The package as recited in claim 13, wherein the upper and lower shields comprises about 1 grams/cm$^2$ of shielding material.

17. The package as recited in claim 13, wherein the upper and lower shields comprise copper tungsten alloy shields.

18. The package as recited in claim 17, wherein the upper and lower alloy shields comprises about 2 grams/cm$^2$ of 90% tungsten and 10% copper.

19. A shielded plastic package for shielding an integrated circuit die against ionizing radiation, comprising:

a plastic package having an integrated circuit die embedded in a first encapsulation material, wherein the first encapsulation material is removed to form an upper cavity and a lower cavity, the upper cavity being formed to within about 5-10 mils of the integrated circuit die and the lower cavity being formed beneath the space to within about 10-20 mils thereof;

an upper shield installed in the upper cavity, wherein the upper shield protects the die against ionizing radiation to the bremsstrahlung limit;

a lower shield installed in the lower cavity, wherein the lower shield protects the die against ionizing radiation to the bremsstrahlung limit; and means for encapsulating the upper and lower shields in a second and a third encapsulating material, respectively.

20. The package as recited in claim 19, wherein:

the first encapsulating material is removed to form a wall along a perimeter of the top side of the package, the wall having a thickness which will contain the second encapsulating material therein.

21. The package as recited in claim 19, wherein:

the first encapsulating material is removed to form a wall along a perimeter of the bottom side of the package, the wall having a thickness which will contain the second encapsulating material therein.

22. The package as recited in claim 19, wherein the upper and lower shields comprises about 1 grams/cm$^2$ of shielding material.

23. The package as recited in claim 23, wherein the upper and lower shields comprise copper tungsten alloy shields.

24. The package as recited in claim 23, wherein the upper and lower alloy shields comprises about 2 grams/cm$^2$ of 90% tungsten and 10% copper.

25. A shielded plastic package for shielding an integrated circuit die against ionizing radiation, comprising:

a plastic package having a space formed in the package for receiving an integrated circuit die, the package further having a first encapsulation material removed from above the space;

an upper shield mounted on the top side of the package above the space, wherein the upper shield protects the space against ionizing radiation to the bremsstrahlung limit;

a lower shield mounted on the bottom side of the package, wherein the lower shield protects the space against ionizing radiation to the bremsstrahlung limit; and means for encapsulating the upper and lower shields in a second and third encapsulating material, respectively.

26. A shielded plastic package for shielding an integrated circuit die against ionizing radiation, comprising:

a plastic package having a space formed in the package for receiving an integrated circuit die, the package further having a first encapsulation material removed to form an upper cavity and a lower cavity, the upper cavity being formed to within about 5-10 mils of the space and the lower cavity being formed beneath the space to within about 10-20 mils thereof:

an upper shield installed in the upper cavity, wherein the upper shield protects the space against ionizing radiation to the bremsstrahlung limit;

a lower shield installed in the lower cavity, wherein the lower shield protects the space against ionizing radiation to the bremsstrahlung limit; and means for encapsulating the upper and lower shields in a second and a third encapsulating material, respectively.

27. A shielded plastic package for shielding an integrated circuit chip against ionizing radiation, comprising:

a plastic package having an integrated circuit chip, a die attach pad, and a lead frame encapsulated in a first encapsulating material, wherein the die attach pad and the lead frame are comprised of a shielding material which protects the integrated circuit chip against ionizing radiation to the bremsstrahlung limit, the lead frame having a plurality of fingers, the integrated circuit chip having a plurality of contact pads electrically connected by wirebonds to a corresponding one of the plurality of fingers;

the package further having the first encapsulating material removed from above the integrated circuit chip and the wirebonds, the first encapsulating material being removed without damaging the integrated circuit chip, the wirebonds, or the lead frame;

an upper shield mounted on the top side of the package above the integrated circuit chip and wirebonds, wherein the upper shield protects the chip against ionizing radiation to the bremsstrahlung limit; and means for encapsulating the upper shield in a second encapsulating material.

* * * * *

Adverse Decisions in Interference

Patent No. 5,406,117, Joseph J. Dlugokocki, Joseph R. Florian, RADIATION SHIELDING FOR INTEGRATED CIRCUIT DEVICES USING RECONSTRUCTED PLASTIC PACKAGES, Interference No. 103,953, final judgment adverse to patentees rendered February 11, 1998, as to claims 1-27.
*(Official Gazette April 21, 1998)*